United States Patent [19]
Jones

[11] Patent Number: 5,847,293
[45] Date of Patent: Dec. 8, 1998

[54] TEST HANDLER FOR DUT'S

[75] Inventor: Elmer R. Jones, North Reading, Mass.

[73] Assignee: Aetrium Incorporated, North St. Paul, Minn.

[21] Appl. No.: 566,940

[22] Filed: Dec. 4, 1995

[51] Int. Cl.⁶ .................................................. G01R 31/26
[52] U.S. Cl. ........................................ 73/865.8; 324/760
[58] Field of Search ......................... 73/865.8; 324/754, 324/755, 760; 209/571, 573; 374/45

[56] References Cited

U.S. PATENT DOCUMENTS

| | | | |
|---|---|---|---|
| 4,604,572 | 8/1986 | Horiuchi et al. | 324/760 |
| 4,926,118 | 5/1990 | O'Connor et al. | 73/865.6 |
| 5,563,521 | 10/1996 | Crumly | 324/754 |
| 5,574,383 | 11/1996 | Saito et al. | 324/755 |

*Primary Examiner*—Robert Raevis
*Attorney, Agent, or Firm*—Samuels, Gauthier & Stevens

[57] ABSTRACT

A handling system for devices under test (DUTs), i.e. semiconductor chips. A rotatable platform is provided which platform has a plurality of boats or nests. The DUTs are inserted in the boats. The platform carrying the DUTs is indexed through a plurality of treatment stations to precondition the chips specifically to bring the chip to a test temperature. At a test station, the chip is removed from the boat and inserted into a manufacturer's test head. The chip is tested, returned to the boat and indexed to a treatment station(s) downstream of the test head where is ultimately removed for further processing.

30 Claims, 3 Drawing Sheets

5,847,293

TEST HANDLER FOR DUT'S

FIELD OF THE INVENTION

This invention relates to an automatic test handling system of electric devices such as integrated circuits ("ICs"), semiconductor chips, and the like. The devices undergo various functional tests and are referred to as devices under test ("DUTs"). More particularly, the invention relates to a test handling system having various mechanical devices which are used to quickly and efficiently transfer boats containing such DUTs from one location to another within the handling system.

BACKGROUND AND BRIEF SUMMARY OF THE INVENTION

In the electronics industry, there is a constant demand for electronic devices, such as integrated circuits or semiconductor chips, to be produced less expensively and in smaller dimensions. One way to increase productivity of such electronic devices, and thereby reduce their unit cost, is to increase the test speed of the chips.

During manufacture chips typically undergo three separate test cycles: (1) in-process testing, such as continuous monitoring of sheets resistivities, junction depths, and other pertinent device parameters, such as current gain and voltage breakdown; (2) a preliminary electrical testing called burn-in; and (3) a detailed final functional testing for reliability and performance to grade or sort the chips. The present invention relates to improvements in the last type of testing.

The final functional testing of chips is one of the more expensive and time consuming stages of the manufacturing process. Automatic highspeed testing is practically mandatory to the final testing of modern chips because a large number of complex tests are required to check even the simplest types of circuits.

One by one each chip is subjected to a series of long and short functional tests. The number and complexity of these functional tests varies from chip maker to chip maker. Long functional testing of digital memory chips generally involves the pattern testing of each chip on an individual basis. Commonly used routines include the generation of checkerboard patterns of 1s and 0s or the floating of a 1 or 0 from cell to cell while the adjacent cells are maintained in the opposite state. For larger memories, the generation of these test patterns requires a larger number of functional tests. Generally, the time required for adequate pattern testing increases at a rate which is proportional to the square of the number of bits of storage in the digital memory chip, thus, as the bit storage capacity of a digital memory chip increases, the time required for adequate pattern testing increases at an exponential rate.

Short functional testing of chips involves the testing of each chip on an individual basis to determine whether it meets the specs set down in a data sheet, e.g. operating speed, and voltage and current parameters. These so-called short functional tests generally require much less testing time than pattern testing.

Both the long and short functional tests have heretofore been performed by chip makers in various sequences and at various temperature levels.

It has become a test technology standard to place a number of chips to be tested on boats. The boats move the chips through a preconditioning step(s), a test step and an optional post conditioning step(s). Usually the preconditioning steps bring the chip to the test temperature. Subsequently, the chip in the test step is positioned so as to be engaged by a test head plate. The test head plate includes test contactors (test pins) for contact with the pins of each DUT to be tested for supplying and receiving the test signals from the device.

Based on the test results, the DUTs are transferred to another location in the test process and sorted for proper handling.

The functional tests are designed to test the chips at a constant temperature, usually the junction temperature. For chips with low power dissipation, e.g. <1 watt, maintaining the temperature constant by convection, flowing a fluid (air stream) across a DUT surface is usually sufficient.

Generally, handling systems are sold to the chip manufacturers and are typically constructed to interface with the manufacturers' chip handling system.

When a chip is performance tested at its maximum capacity and maximum system clock frequency, the ambient temperature is controlled to maintain the junction temperature of the chip constant in order to provide a reliable frame of reference or standard against which each chip is tested.

As chip densities and counts (per chip) continue to increase, the power dissipation ($P_D$) of a chip increases markedly. $P_D$ also increases, proportionately, with increasing clock rate (for the common CMOS devices). The vast majority of digital systems change their internal states in synchronism with a square wave or clock signal common to the entire chip. Performance or useful work performed by a chip per time (R), is usually directly proportional to the clock rate or frequency. Current and proposed design $P_D$'s are becoming prohibitive (the chips are getting to hot). Chips are designed to operate in highly temperature variable environments. The heat generated by a chip affects its temperature and thus feedback exists. It is always desirable to operate the chip at a constant internal temperature (junction temperature). Typically, this internal temperature is set to be less than the maximum allowable to allow for the vialability and power consumption goals of the chip design. With the testing of the current, and the expected proposed chip designs, the total heat impinging on the chip increases significantly (due either to external temperature increases or increases in the system clock frequency).

Therefore, as the ability of chip manufacturers to reduce the physical size of chips has improved, the power dissipation in the chips so manufactured has accordingly increased. As a result, when the DUTs are tested, it has become increasingly necessary to provide some form of cooling to maintain the DUT at a constant temperature, usually its junction temperature.

Prior art handling systems are designed primarily for use with complementary systems for removal of the heat from the DUTs by convection. Although some systems exist for removing the heat from the DUTs by heat exchange with a liquid, these systems have proved cumbersome and do not remove the heat from the DUT rapidly enough. Also, it is difficult to precisely monitor and control the temperature of the DUT.

The increased power encountered with the newer chips results in at least two major problems with the state-of-the-art handling systems. First, their inability to precisely control the DUT temperature when it is undergoing the functional tests. Second, they do not expeditiously load, test and unload the chips. The first problem has been overcome by an invention disclosed in a co-pending application entitled Gimbal Heat Exchange Head For A DUT which application is hereby incorporated by reference in its entirety into this disclosure. The second problem is overcome by the invention specifically disclosed herein which more efficiently (time and control) prepares a DUT for functional testing, loads the DUT into the tester, and removes the DUT from the tester for further sorting. The system disclosed herein is effectively used with the thermoconductive module disclosed in my co-pending application. However, it may also be effectively used with thermoconductive modules disclosed in my earlier issued U.S. Pat. Nos. 5,126,656; 5,164,661; 5,315,240; and PCT Publication WO94/22029 which are hereby incorporated by references in their entireties into this disclosure.

The present invention is directed to a handling system especially for use with heat exchange fluids which preconditions DUTS, presents DUTs to the chip manufacturer's tester, maintains the DUT at a target temperature (usually the junction temperature) during functional testing and optionally post conditions the DUT.

The DUTs are each inserted in a boat and there are a plurality of boats on a platform. The platform indexes the boats through a plurality of stations. A thermoconductive module is placed in heat exchange relationship with the DUT at selected stations.

In a preferred embodiment, the boats are carried on a carousel which rotates in an index fashion. The thermoconductive modules are in register with at least some of the stations through which the boats are indexed. The thermoconductive modules are ganged in a press assembly. The thermoconductive modules communicate with a source of heat exchange fluids and a programmable controller which controls the flow of heat exchange fluid through the thermoconductive modules.

The carousel and press assembly also communicate with a programmable controller which controls the relative movements of the press assembly and carousel in timed sequence.

In one embodiment, the system comprises a plurality of boats on a platform, each of the boats adapted to support a DUT, the platform adapted to be indexed through a plurality of stations. In register with at least some of the stations are thermoconductive heat exchange modules which engage the DUTs. The DUT is moved through a series of preconditioning stations to bring its temperature to the desired test temperature. The DUT is indexed to a test station where it engages the manufacturer's test head. A thermoconductive module at the test station maintains the temperature of the DUT at the control temperature. Subsequently, the DUT is indexed through a plurality of stations to bring the DUT to a temperature suitable for further handling and sorting.

DESCRIPTION OF THE PREFERRED EMBODIMENT(S)

Figure 1:
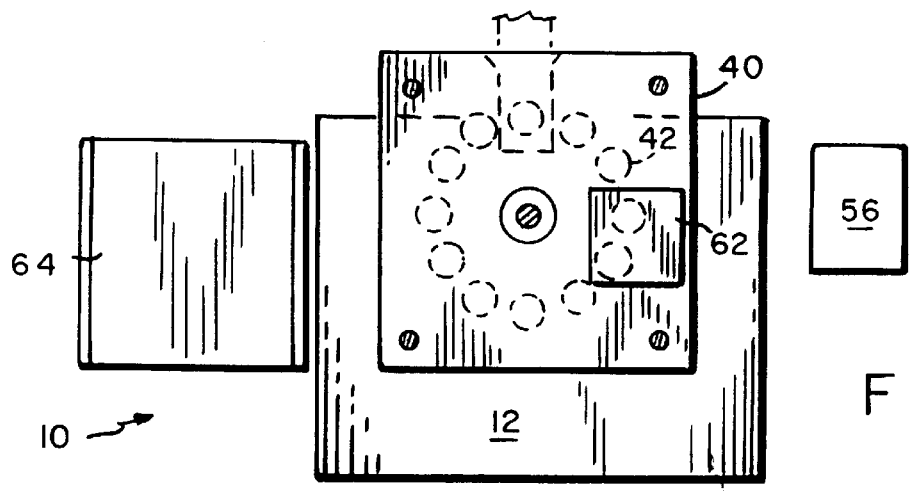
FIG. 1 is a plan view of a system embodying the invention.
Figure 2:
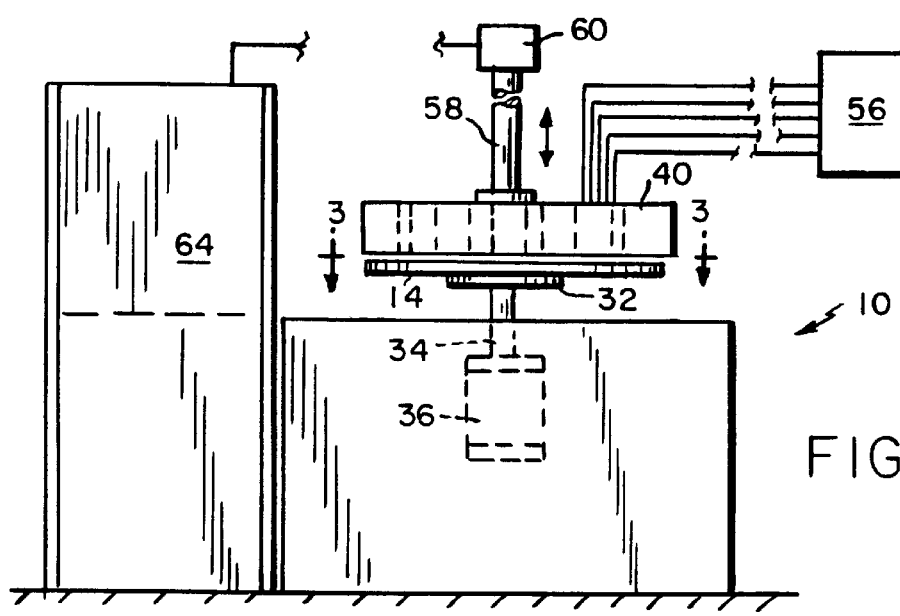
FIG. 2 is a front view of the system of FIG. 1.
Figure 3:
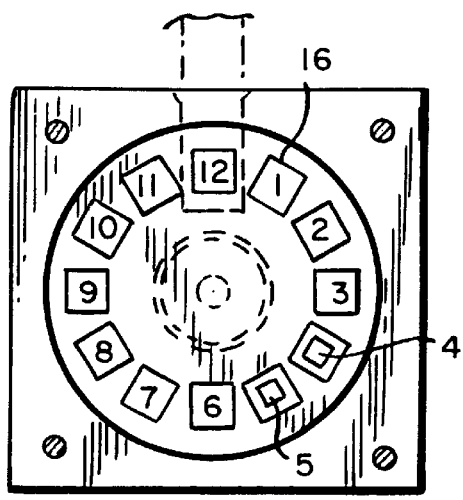
FIG. 3 is a plan view taken along lines 3—3 of FIG. 2.

Referring to FIGS. 1, 2 and 3 a system embodying the invention is shown generally at 10 and comprises a support housing 12, a carousel 14, a press assembly 40 and controllers (such as programmable logic controllers) 56 and 64. The carousel 14 is supported on the housing 12 and is characterized by rectangular aperture 16. On the underside of the carousel 14 is a support plate 32 joined to a shaft 34 which is driven by a stepping motor 36. This effects rotatable movement of the carousel 14 as will be described.

Referring to FIG. 2, a piston 58 is secured to the press assembly 40 and is received in a cylinder 60. The piston effects vertical reciprocating motion of the press assembly 40. The press assembly is further characterized, see FIG. 1, by a recess 62. The cylinder 60 and the motor 36 communicate with the controller 64.

Motion of the carousel 14 is rotatable about the axis of the shaft 34. The motion of the press assembly (thermoconductive modules) is reciprocal with reference to the axis of the piston 58.

Referring to FIG. 3, the boats and therefor the DUTs when carried by a boat, as shown in FIG. 3, are indexed through stations one through twelve.

Figure 4:
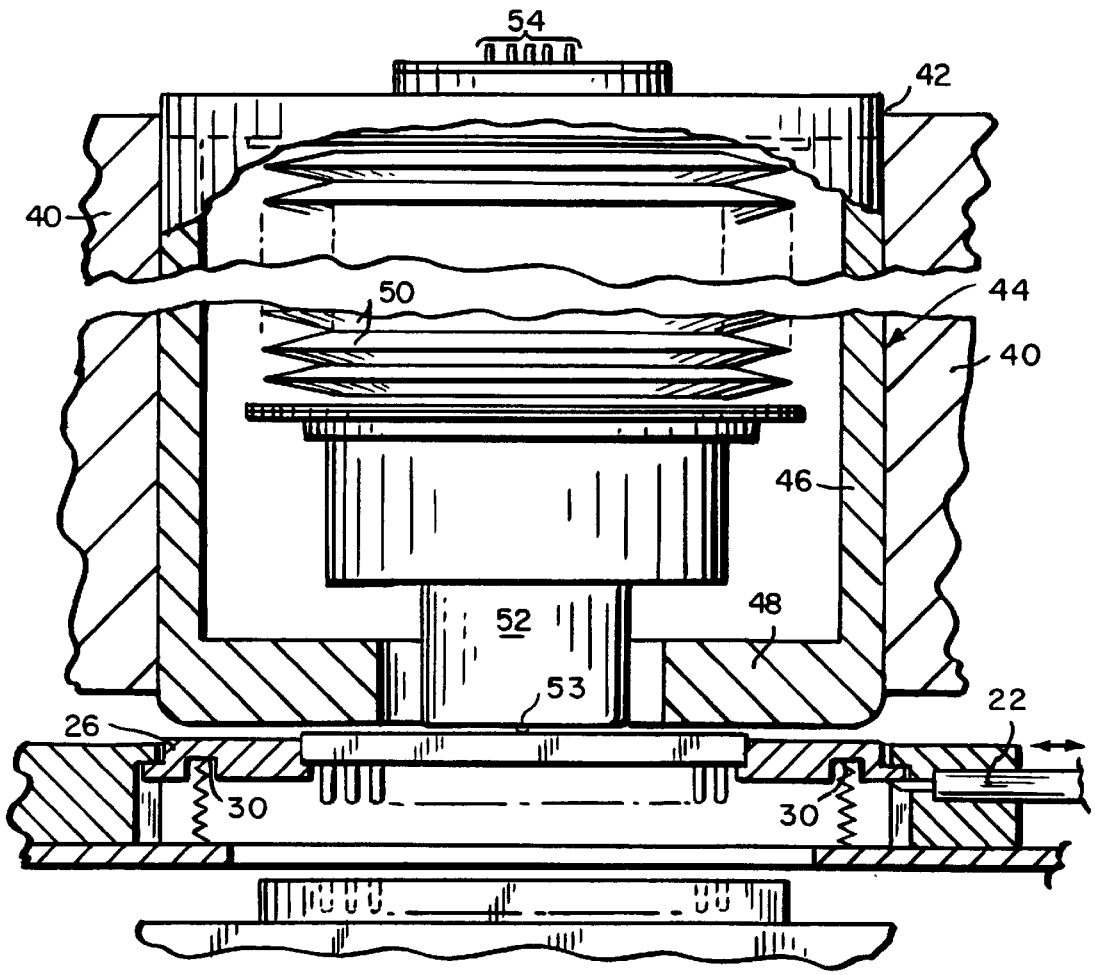
FIG. 4 is a front partially sectional view of a thermoconductive module.
Figure 6:
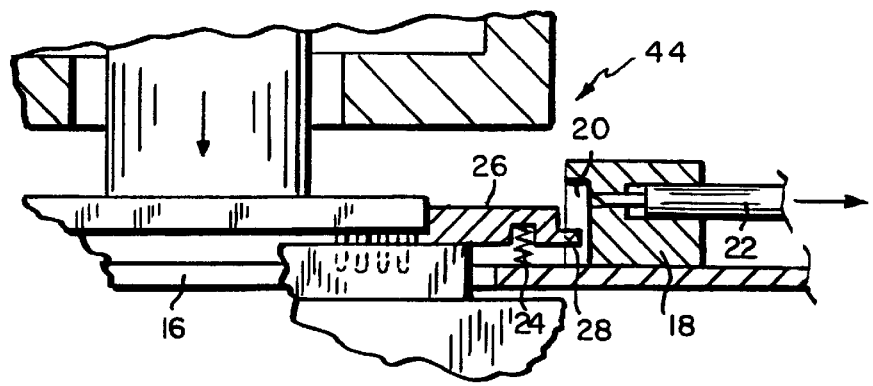
FIG. 6 is a perspective, partly broken away view of a DUT inserted into a test head.
Figure 5:
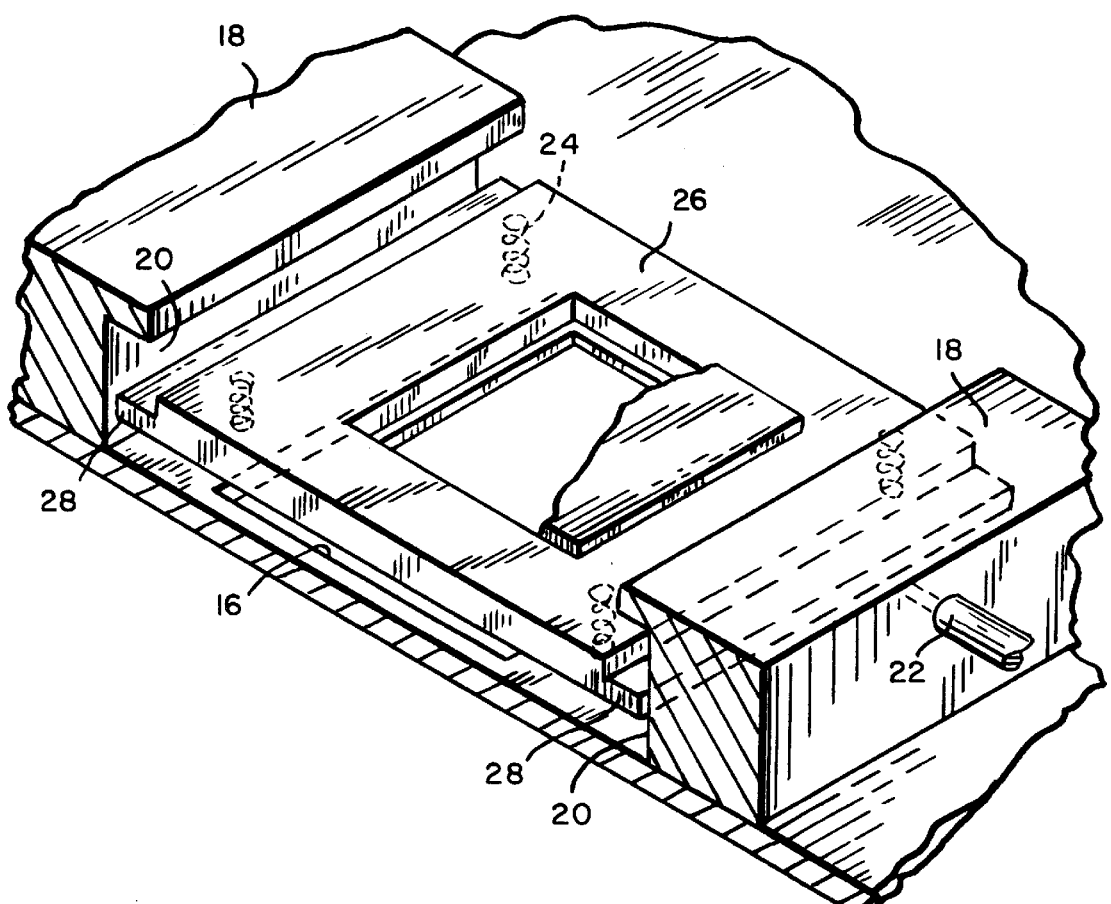
FIG. 5 is an enlarged sectional view of a carousel and associated boat.

Referring to FIGS. 4, 5 and 6, on either side of an aperture 16 are pillow blocks 18 characterized by recesses 20. At least one of the pillow blocks 18 has secured therein a solenoid actuated locking pin 22. Also supported on the carousel are springs 24. Boats 26 are received in the apertures 16, the boats comprising outwardly extending flanges 28 at either end thereof and holes 30. The flanges 28 extend into the recesses 20 and the springs 24 are received in the holes 30. This allows the boats 26 to travel in the recesses 20. The springs maintain the boats 26 biased upwardly.

The press assembly 40 is characterized by cavities 42 in which are received thermoconductive modules 44. A module 44 comprises a rigid outer cylindrical wall 46 which terminates at its lower end in an inner flange 48. The module 44 also comprises a bellow-like wall 50 which is joined to a heat exchange chamber 52 having a thermister 53 extending therefrom. Conduits for the flow of heat exchange fluids into and out of the thermoconductive module and for temperature measurements are shown generally at 54. These conduits communicate with the controller 56.

The control of a heat exchange fluid through thermoconductive modules (flow rates, temperatures and volumes) comprise process flow parameters that are well within the skill of the art. The movement of the boats through the respective stations, the movement of the press assembly in timed sequence and the insertion and removal of DUT's from the boats per se are also well within the skill of the art.

The thermoconductive modules 44 are in register with the stations one, two, three, six, seven, eight, nine, ten, eleven and twelve. At stations four and five , there are no thermoconductive modules and the press assembly 40 is recessed at 62 to allow for the insertion and removal of DUTs.

The operation of the invention will be described with references to DUTs to be functionally tested at station twelve at a temperature of 80° C. for a duration of 60 seconds.

The operation of the invention will be described with reference to the insertion, preconditioning, testing, post conditioning and removal of a DUT. As will be clearly understood in the operation of the preferred embodiment, the DUTs will be loaded in the boats at all twelve stations when the handling system is fully utilized.

A DUT is loaded into a boat 26, such as by a robotic hand, at station five. At the same time, a previously tested DUT at station four would be removed or left in the boat for re-testing as desired.

After the DUT has been loaded in the boat with the press assembly in an upper, non-engaged position, the carousel rotates or indexes moving the DUT to station six. The carousel stops and the press assembly moves to a lower, engaged position where the thermoconductive module 44 at station six is placed in heat exchange relationship with the DUT, as shown in FIG. 6. The heat exchange module 44 raises the temperature of the DUT from 20° to 30° C. After the DUT has reached a pre-determined temperature, the press assembly 40 moves to its upper position, and the carousel rotates, moving the DUT to station number seven. Again, the press assembly moves to its lower position where the thermoconductive module at station seven engages the DUT in heat exchange relationship. The temperature of the DUT is raised from 30° to 40° C., the press assembly moves to its upper position, and the carousel rotates, indexing the DUT to position number eight. This series of steps continues through station eleven where the DUT, having its temperature increased in successive 10° C. increments, is raised to 80° C. at station number eleven.

It will be understood that the length of time the press assembly, and therefore the heat exchange modules, remain engaged in heat exchange relationship is determined by the test time required at station number twelve. For this example, where the test time is 60 seconds then the pre-conditioning temperature increments which would then control the flow rate of the heat exchange fluids would be based upon the DUT reaching its predetermined temperature within the 60 second time frame.

Referring to FIGS. 5 and 6, when the carousel indexes the DUT to station twelve, the locking pin 22 associated with the boat is retracted and the thermoconductive module 44 engages the boat. More particularly, the inner flange portion 48 of the outer wall 46 of the thermoconductive module 44 engages the upper surface of the boat and the perimeter of the DUT. As shown in FIG. 6, with the pin withdrawn, when the electroconductive module moves to its engaged heat exchange position, the boat is moved downwardly with the pins of the DUT engaging the sockets of the test head. After completion of the test cycle, when the press assembly is raised, the springs 24 bias the boat with the DUT upwardly, removing the DUT from the test head. The pin 22 then extends to lock the boat into its upper position.

If post-conditioning steps are required, such as by cooling the DUT to a temperature where it is suitable for handling and sorting, the DUT is indexed through stations one, two and three where the thermoconductive modules can optionally be employed to cool the DUT. Lastly, the DUT moves to station four where it is removed from the boat.

The foregoing description has been limited to a specific embodiment of the invention. It will be apparent, however, that variations and modifications can be made to the invention with the attainment of some or all of the advantages of the invention. Therefore, it is the object of the appended claims to cover all such variations and modifications as come within the true spirit and scope of the invention.

Having described my invention, what I claim is:

1. A system for handling DUT's to control and measure the temperature of the DUT which comprises:

a plurality of boats moveably secured to a platform for movement between a first upper position and a second lower position;

means to move the platform to index the boats through at least one conditioning station upstream of a test station, at least some of the boats carrying DUT's;

thermoconductive heat exchange module adapted to be releasably engaged to the DUT's to control and measure the temperature of the DUT's at a station the thermoconductive module adapted for reciprocating movement along an axis which axis is perpendicular to the plane through which the platform moves;

means to release the boat from the platform when the boat is at the test station, whereby the movement of the thermoconductive module carries the boat and the DUT from a first position to a second position and into engagement with the test station for functional testing of the DUT;

means to move the boat from the second position to the first position; and means to control the indexing of the DUT's in timed sequence through the stations.

2. The system of claim 1 wherein the platform is characterized by means to releasably lock the boat carrying the DUT in the first position.

3. The system of claim 1 wherein the means to move the boat from the second to the first position comprises springs on the platform engaging the boat and biasing the boat to the first position.

4. The system of claims 1, 2 or 3 wherein the boat comprises a central aperture in which the DUT is received.

5. The system of claim 1 wherein the platform is circular and rotates through the stations.

6. The system of claim 5 wherein the thermoconductive module is adapted for reciprocating movement along an axis, which axis is perpendicular to the plane through which the platform rotates.

7. The system of claim wherein the thermoconductive modules are in register with the stations.

8. The system of claim 1 wherein the modules are secured to a press assembly.

9. The system of claim 1 which includes:

means to introduce and remove heat exchange fluid from the thermoconductive module.

10. The system of claim 1 which includes:

means to flow a heat exchange fluid through the module;

means to measure the temperature of the surface of the DUT; and means to measure the temperature of the heat exchange fluid in the thermoconductive module.

11. The system of claim 1 wherein the boats are releasably secured in the platform and which includes:

means to release the boat from the platform when the boat is at the position corresponding to the test station whereby the DUT may engage the test station for functional testing.

12. A system for handling DUT's to control and measure the temperature of the DUT which comprises:

a plurality of boats on a circular platform;

means to rotate the boats through a plurality of stations, at least some of the boats carrying DUT's;

a thermoconductive heat exchange module adapted to be releasably engaged to the DUT's to control and measure the temperature of the DUT's at the station adapted for reciprocating movement along an axis, which axis is perpendicular to the plane through which the platform rotates, the thermoconductive module in register with the stations.

13. The system of claim 12 wherein the modules are secured to a press assembly.

14. The system of claim 12 which includes:

means to introduce and remove heat exchange fluid from the thermoconductive modules.

15. The system of claim 12 which includes:

means to measure the temperature of the surface of the DUT; and means to measure the temperature of the heat exchange fluid in the thermoconductive module.

16. The system of claim 12 wherein the boats are releasably secured in the platform and which includes:

means to release the boat when the boat is at position corresponding to the test station whereby the DUT may engage the test station for functional testing.

17. A method for handling DUTs, each DUT having a DUT surface, a plurality of conditioning stations including a first conditioning station, at least one intermediate conditioning station and a final conditioning station and a test station, the test station having a test head, a plurality of thermoconductive modules adapted for reciprocating motion to engage in heat transfer relationship the DUT surfaces, said modules located at the stations and wherein the DUTs are supported in spaced apart relationship on a support surface, the support surface adapted to travel to place the DUTs in registration with each of the conditioning stations and the test station which method comprises:

moving the DUTs in timed sequence to each of the conditioning stations;

effecting movement of the thermoconductive module at each conditioning station to place the thermoconductive module into heat exchange relationship with the DUT surface to bring the DUTs to a predetermined temperature;

moving subsequently a DUT from the last conditioning station to the test station to place the DUT in registration with the test head; and testing the DUT at the test head.

18. The method of claim 17 which comprises:

increasing progressively the temperature of a DUT as the DUT is sequentially conditioned from the first the last conditioning station.

19. The method of claims 17 or 18 which comprises:

placing the DUT in electrical communication with the test head; and controlling the temperature of the DUT while it is in communication with the test head.

20. The method of claim 19 which comprises:

moving the DUT from the support surface to place the DUT in communication with the test head.

21. The method of claim 20 which comprises:

moving the DUT in a direction which is normal to the direction of travel of the support surface.

22. The method of claim 19 wherein there is at least one deconditioning station, the deconditioning station having a heat exchange surface, which method comprises:

effecting relative movement of a DUT between the test head and the deconditioning station to place the DUT in registration with the deconditioning station to decondition the DUT.

23. A method for handling DUTS, each DUT having a DUT surface, wherein the DUTs are adapted for relative movement between a plurality of conditioning stations including a first conditioning station, a last conditioning station, intermediate conditioning stations and a test station which has a test head wherein the DUTS are supported in spaced apart relationship on a support surface, the support surface adapted to travel to place the DUTs in registration with each of the conditioning stations and the test station, a plurality of thermoconductive modules adapted to engage the DUT surfaces at the conditioning stations, which method comprises:

moving the DUTs in timed sequence from the first conditioning station, to the intermediate conditioning stations, to the last conditioning to place the DUTS in registration with the conditioning stations;

placing the thermoconductive modules into engagement with the DUT surfaces;

conditioning thermally the DUTs at said conditioning stations to bring the DUTs to a predetermined temperature;

moving subsequently a DUT from the last conditioning station to the test station;

effecting movement of the DUT from a first position to a second position where the DUT is placed into communication with the test head; and testing the DUT at the test head.

24. The method of claim 23 which comprises:

effecting the relative movement of the DUT between the conditioning stations and the test station in timed sequence.

25. The method of claim 23 which comprises:

effecting relative movement between the thermoconductive module and the DUT surface at the conditioning stations, to place the heat exchange surface and the DUT surface into heat exchange relationship.

26. The method of claim 25 which comprises:

moving the thermoconductive module with reference to the DUT surface.

27. The method of claim 26 wherein the thermoconductive module is adapted for reciprocating motion with reference to the DUT surface.

28. The method of claim 23 which comprises:

increasing progressively the temperature of a DUT as the DUT is sequentially conditioned from the first to the last station.

29. The method of claim 23 which comprises:

placing the DUT in electrical communication with the test head; and controlling the temperature of the DUT while it is in communication with the test head.

30. The method of claim 29 wherein there is:

at least one deconditioning station, which method comprises:

effecting relative movement of a DUT between a thermoconductive module and the deconditioning station to place the DUT in registration with the deconditioning station to decondition the DUT.

* * * * *